US009263313B2

(12) United States Patent
Sato et al.

(10) Patent No.: US 9,263,313 B2
(45) Date of Patent: *Feb. 16, 2016

(54) PLASMA PROCESSING APPARATUS AND PLASMA PROCESSING METHOD

(71) Applicant: Hitachi High-Technologies Corporation, Minato-ku, Tokyo (JP)

(72) Inventors: Kohei Sato, Tokyo (JP); Yuya Mizobe, Tokyo (JP); Tomohiro Ohashi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/183,552

(22) Filed: Feb. 19, 2014

(65) Prior Publication Data

US 2014/0295671 A1    Oct. 2, 2014

(30) Foreign Application Priority Data

Mar. 29, 2013    (JP) ................................. 2013-070952

(51) Int. Cl.
| | |
|---|---|
| H01L 21/3065 | (2006.01) |
| H01L 21/67 | (2006.01) |
| H01L 21/683 | (2006.01) |
| H01J 37/32 | (2006.01) |

(52) U.S. Cl.
CPC ....... *H01L 21/6831* (2013.01); *H01J 37/32935* (2013.01)

(58) Field of Classification Search
USPC .................................................... 216/59, 67
See application file for complete search history.

(56) References Cited

U.S. PATENT DOCUMENTS

| | | | | |
|---|---|---|---|---|
| 5,737,177 | A * | 4/1998 | Mett et al. ...................... | 361/234 |
| 5,946,184 | A * | 8/1999 | Kanno et al. ................... | 361/234 |
| 2009/0178764 | A1* | 7/2009 | Kanno et al. ............. | 156/345.52 |
| 2011/0297082 | A1* | 12/2011 | Watanabe et al. ............. | 118/663 |
| 2013/0003250 | A1* | 1/2013 | Morimoto et al. ............ | 361/234 |
| 2013/0107415 | A1* | 5/2013 | Banna et al. ................... | 361/234 |
| 2014/0001154 | A1* | 1/2014 | Sato et al. ....................... | 216/67 |

FOREIGN PATENT DOCUMENTS

JP    09-167794 A    6/1997

* cited by examiner

*Primary Examiner* — Shamim Ahmed
(74) *Attorney, Agent, or Firm* — Miles & Stockbridge, P.C.; Eric G. King

(57) ABSTRACT

A plasma processing apparatus is provided which includes a processing chamber disposed in a vacuum container, in a decompressed inside of which plasma is formed, a sample stage disposed in a lower part of the processing chamber, on a top surface of which a sample is mounted, a dielectric film made of a dielectric that forms a mounting surface on which the sample is mounted, and electrodes arranged inside the dielectric film and supplied with power for chucking and holding the sample onto the dielectric film, and when the sample is mounted on the sample stage, the sample is kept mounted on the sample stage until a sample temperature becomes a predetermined temperature or until a predetermined time elapses, and power is then supplied to the electrodes to chuck the sample to the sample stage and then start processing on the sample using the plasma.

4 Claims, 7 Drawing Sheets

PLASMA PROCESSING APPARATUS AND PLASMA PROCESSING METHOD

BACKGROUND OF THE INVENTION

The present invention relates to a plasma processing apparatus or a plasma processing method that processes a substrate-shaped sample such as a semiconductor wafer in a processing chamber in a vacuum container using plasma formed therein.

A plasma processing apparatus processes a sample such as a semiconductor wafer mounted on a sample stage using plasma generated above the sample and removes a target film from the surface of the sample through chemical reaction between the plasma and the sample or causes a film to be deposited onto the surface of the sample. The former is called "etching processing" and the latter is called "CVD (chemical vapor deposition)."

In such plasma processing, processing proceeds through chemical reaction between ions or active gas species and the sample using chemically active plasma. Whether a chemical reaction occurs or not, or whether a byproduct generated by a chemical reaction becomes a gas and is desorbed/released (etched) from the surface of the sample or a byproduct is solidified and deposited onto the surface of the sample (CVD) is greatly influenced by a temperature of the sample.

For example, when a sample of a material whose byproduct has a low vapor pressure is etched, it is necessary to reduce a pressure in a plasma processing chamber or increase a sample temperature so that the byproduct becomes a gas and is desorbed/released from the surface of the sample. Stably maintaining a plasma atmosphere requires the plasma processing chamber to actually have a certain degree of pressure ($\geq$ on the order of 0.1 Pa) and also requires the sample temperature to be sufficiently high.

In this way, it is necessary to control the sample temperature in accordance with a target process. Thus, a method is adopted which controls the sample temperature to a desired temperature by controlling the sample stage temperature. As such a configuration of adjusting the sample stage temperature, conventionally, a temperature-controlled heat exchange liquid is made to flow through the sample stage or a heater is incorporated in the sample stage for heating.

On the other hand, the sample temperature is adjusted through a heat transfer to/from the sample stage. For an efficient heat transfer between the sample and a top surface of the sample stage on which the sample is mounted, it is a general practice that the sample is chucked to the mounting surface by an electrostatic chuck force or the like and a heat transfer gas such as a He gas is supplied to a clearance space between the sample and the mounting surface. Furthermore, since such temperature adjustment of the sample is greatly influenced by heat transfer efficiency, electrostatic chuck conditions for holding the sample onto the mounting surface and a region to be chucked to improve a heat transfer have been conventionally taken into consideration.

As such a prior art, one described in JP-A-09-167794 is known. This prior art discloses a technique which supplies a heat transfer gas to a wafer held on a sample stage by a plurality of dipolar chuck electrodes to adjust a wafer temperature, then keeps the wafer chucked onto the sample stage while causing the plurality of chuck electrodes to operate as monopolar electrodes, and thereby processes the wafer.

SUMMARY OF THE INVENTION

A substrate-shaped sample such as a semiconductor wafer is generally provided at a normal temperature before plasma processing, the sample before processing is mounted on a sample stage set to a predetermined temperature, then chucked onto the sample stage, made to transfer heat to/from the sample stage, whereby the temperature thereof is adjusted. For example, when the sample is heated to a high temperature of 200° C. to 300° C. to perform plasma processing, the sample stage is controlled and kept at a high temperature all the time, the sample is mounted on the sample stage which is controlled at a high temperature, then chucked onto the sample stage by an electrostatic chuck force, and the heat transfer gas filling the clearance space is heated as a heat transfer medium. Plasma processing starts after the wafer temperature reaches a temperature that matches plasma processing conditions.

In such a case, the above-described prior art has not taken into consideration the fact that since the sample thermally expands while being chucked onto the sample stage, the reverse side of the sample and the front side of the sample stage wear out, micro foreign substances are produced or surface roughness of the front side of the sample stage changes, thereby causing contact heat transfer efficiency between the sample and the sample stage to change and deteriorating controllability of the sample temperature.

It is an object of the present invention to provide a plasma processing apparatus or a plasma processing method that reduces generation of micro foreign substances and wearing of a sample stage surface, and provides high productivity.

The above-described object is achieved by a plasma processing apparatus provided with a processing chamber disposed in a vacuum container, in a decompressed inside of which plasma is formed, a sample stage disposed in a lower part of the processing chamber, on a top surface of which a sample to be processed using the plasma is mounted, a dielectric film made of a dielectric that forms a mounting surface on which the sample above the sample stage is mounted, and a plurality of electrodes arranged inside the dielectric film and supplied with power for chucking and holding the sample onto the dielectric film, wherein when the sample is mounted on the sample stage, the sample is kept mounted on the sample stage until a sample temperature becomes a predetermined temperature or until a predetermined time elapses, and power is then supplied to the electrodes to chuck the sample and start processing on the sample using the plasma.

The above-described object is also achieved by a plasma processing method including: mounting a sample to be processed on a dielectric film on a sample stage disposed in a lower part in a processing chamber disposed inside a vacuum container, holding, while keeping the sample mounted on the sample stage, the sample on the sample stage until a sample temperature becomes a predetermined temperature or until a predetermined time elapses, and then supplying power to film-shaped electrodes arranged inside the dielectric film to chuck the sample onto the sample stage and start processing on the sample using the plasma.

Other objects, features and advantages of the invention will become apparent from the following description of the embodiments of the invention taken in conjunction with the accompanying drawings.

DESCRIPTION OF THE EMBODIMENTS

Hereinafter, an embodiment of the present invention will be described with reference to the accompanying drawings.

An embodiment of the present invention will be described with reference to FIGS. 1A to 6.

Figure 1A:
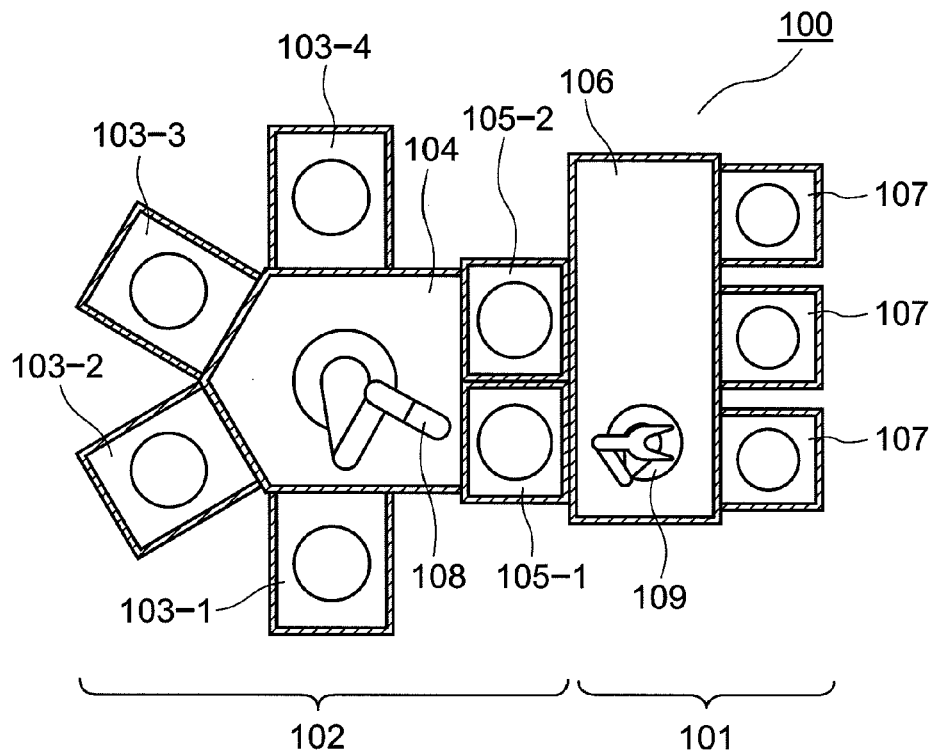
FIGS. 1A and 1B show an overview of a configuration of a vacuum processing apparatus provided with a plasma processing apparatus according to an embodiment of the present invention.
Figure 1B:
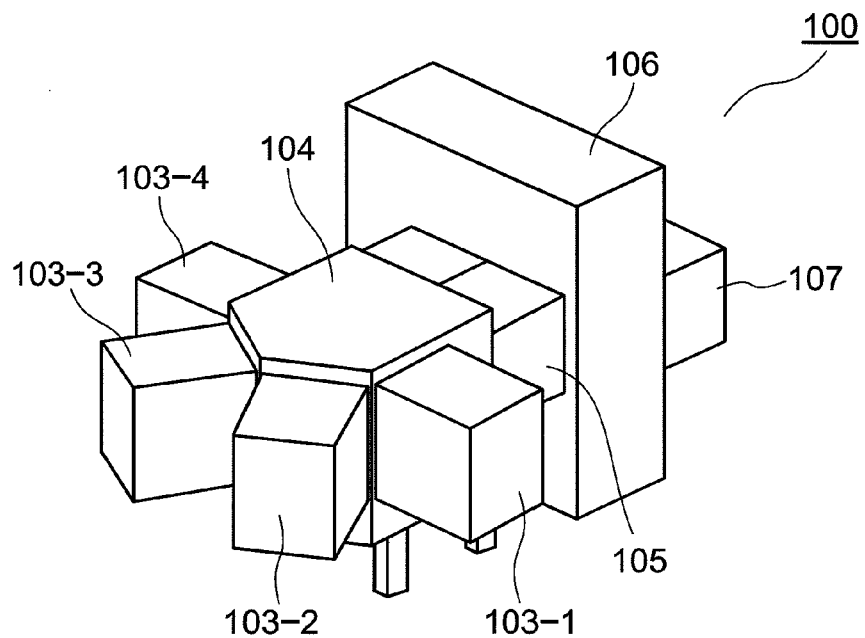

FIGS. 1A and 1B show an overview of a configuration of a vacuum processing apparatus provided with a plasma processing apparatus according to an embodiment of the present invention. FIG. 1A is a top view illustrating a configuration of a vacuum processing apparatus and FIG. 1B is a perspective view of the same.

The vacuum processing apparatus according to the present embodiment is divided into an atmospheric block 101 and a processing block 102 in a front/back direction thereof (left/right direction in the drawing where the right side corresponds to the front side). The atmospheric block 101 located on the front side of the vacuum processing apparatus and facing a passage through which a cassette accommodating a plurality of substrate-shaped samples to be processed such as semiconductor wafers is transferred is a portion that performs operations such as unloading or loading the samples from/into the cassette under an atmospheric pressure inside and further positioning the unloaded samples. Furthermore, the processing block 102 located on the rear side of the vacuum processing apparatus, disposed behind the atmospheric block 101 and connected thereto is a portion that transfers samples such as wafers under a pressure decompressed from an atmospheric pressure and performs processing or the like, and includes a portion that increases/decreases a pressure with the samples being mounted inside at a position where the processing block 102 is connected to the atmospheric block 101.

The atmospheric block 101 has a case 106 provided with a transfer robot that holds and transfers a sample on an arm into a space therein, and a plurality of cassette stands 107, on a top surface of which cassettes accommodating a plurality of samples for processing or for cleaning are placed are arranged in parallel along the front surface (forward passage) of the case 106 on the front side of the case 106.

The processing block 102 is provided with processing units 103-1, 103-2, 103-3 and 103-4 that reduce a pressure down to a predetermined value and process the samples, a transfer chamber 104 that has a flat polygonal shape in a top view, has side walls corresponding to sides of the polygon connected to the processing units, and transfers the samples to the respective processing units under a pressure decomposed to or approximate to the predetermined value, and further lock chambers 105-1 and 105-2 that are vacuum containers located between the transfer chamber 104 and the atmospheric block 101 for connecting the two and that can reduce an inner pressure down to an atmospheric pressure and to the predetermined value or a value approximate thereto. This processing block 102 is a unit that is connected to a vacuum pump (not shown) such as a turbo molecular pump or roughing vacuum pump, and that can be decompressed and kept at a pressure with a high degree of vacuum.

Parts in the processing units 103-1 to 103-4 are controlled to a temperature that matches process conditions and operations thereof are adjusted according to a command signal from a control unit (not shown) so that the sample temperature becomes 200 to 300° C. in the present embodiment. On the other hand, the vacuum transfer chamber 104, atmospheric transfer chamber 106 and cassettes 107 are set to a normal temperature or a range of temperatures that can be assumed as the normal temperature, and the samples are transferred to the processing units 103-1 to 103-4 in a normal temperature state, heated to a predetermined temperature in the processing units and then processed.

Figure 2:
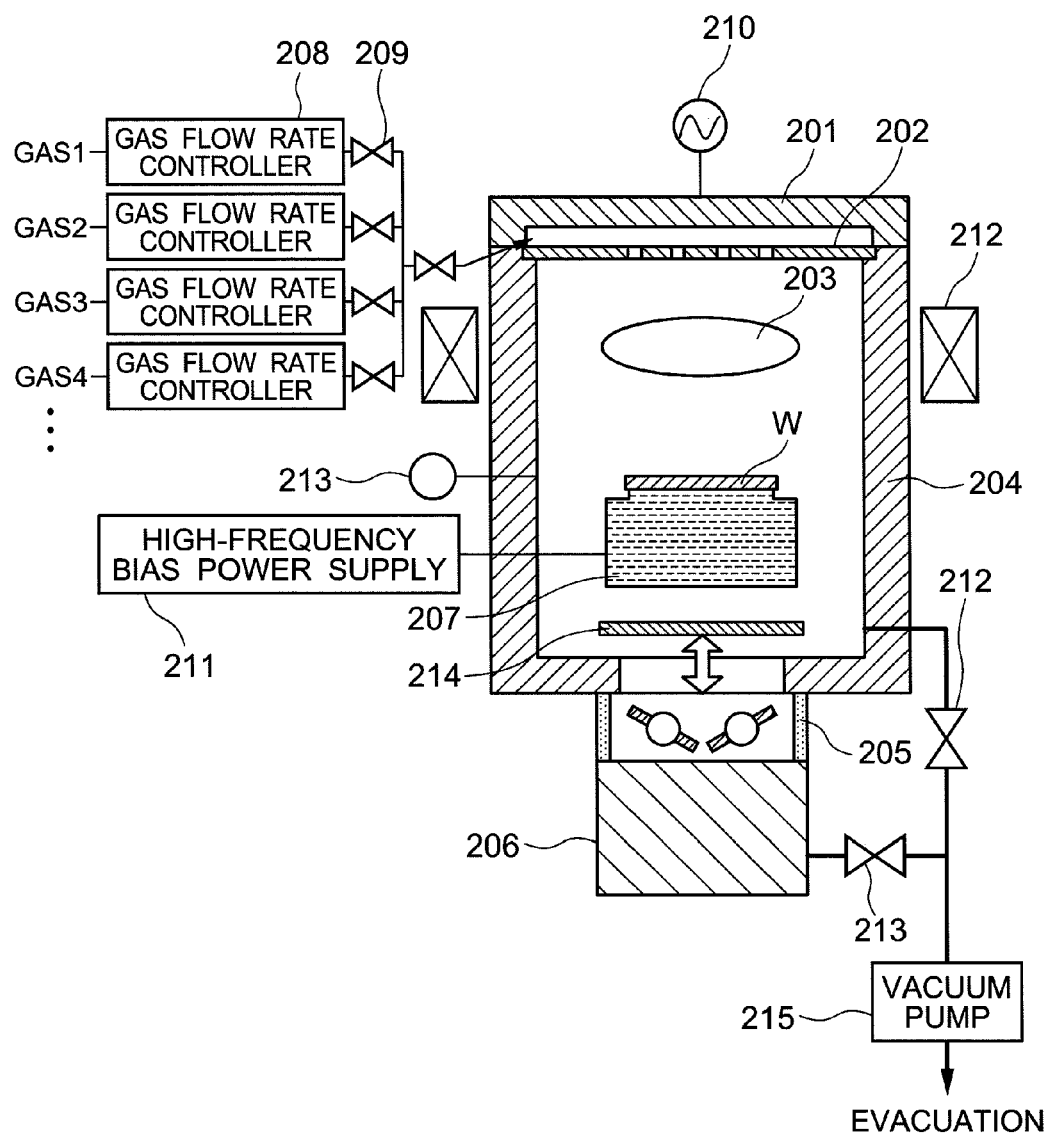
FIG. 2 is a longitudinal cross-sectional view illustrating an overview of a configuration of the plasma processing apparatus shown in FIGS. 1A and 1B.

FIG. 2 illustrates an overview of an inner configuration of the processing container of the processing unit 103 shown in FIGS. 1A and 1B. FIG. 2 is a longitudinal cross-sectional view illustrating an overview of the configuration of the plasma processing apparatus shown in FIGS. 1A and 1B.

In the present embodiment, the processing unit 103 is a plasma etching processing apparatus that applies etching processing to a sample W using plasma 203 formed in an inner space by mounting and holding the sample W on a sample stage 207 disposed in a lower part in a processing chamber which forms a cylindrical space inside the processing container. The processing container shown in the present drawing is schematically constructed of a circular cover 201 and a vacuum container 204 having a cylindrical outside wall. The processing chamber which is an inner space sealed with a sealant such as an O-ring sandwiched between an outer circumferential edge of the cover 201 and a top end of a cylindrical part of the vacuum container 204 and hermetically separated from the space of an outside atmospheric pressure is connected to a vacuum pump 206 such as a turbo molecular pump disposed below the vacuum container 204 and connected thereto. By driving the vacuum pump 206, an inner pressure thereof is reduced to a high degree of vacuum and maintained.

Here, the vacuum pump 206 including a turbo molecular pump cannot exhaust a gas having a pressure higher by a predetermined value than a pressure suitable for processing in the processing chamber in the vacuum container 204. Thus, in the present embodiment, a valve 212 is opened beforehand to evacuate the interior of the processing chamber which is a space inside the vacuum container 204 and in which plasma is formed to a pressure at which the vacuum pump 206 can be driven using a vacuum pump 215 made up of a rotary pump or the like as a roughing vacuum pump, and valves 213 and 214 are then opened to evacuate the processing chamber in the processing container 204 and reduce the pressure thereof to a high degree of vacuum using both the vacuum pumps 206 and 215.

Note that the vacuum pump 215 can exhaust the gas at an atmospheric pressure, and is used to evacuate the processing chamber until the pressure reaches a level at which the vacuum pump 206 can be operated safely. Furthermore, the vacuum pump 206 may be driven to rotate even when the valve 212 or 214 is closed.

Gas flow rate controllers 208 adjust a flow rate of a processing gas supplied into the processing chamber to form the plasma 203 in a space in the processing chamber above the sample stage 207 and process the sample W. In the present embodiment, a processing gas which is a mixture of a plurality of types of gases is used, and valves 209 and the gas flow rate controllers 208 are arranged on gas lines through which the respective types of gases flow to adjust the flow rates of the gases to ones suitable for processing.

The plurality of gas lines are connected together and merged at a confluence point on the downstream side of the respective gas flow rate controllers 208, the plurality of types of gases are mixed together and passed through one gas line as a gas having a composition of a predetermined ratio and supplied to the vacuum processing container. The gas line is connected to an upper part of the vacuum processing container and introduced into a space having a predetermined height disposed between a gas diffusion board 202 and the cover 201 making up a ceiling surface above the processing chamber.

The gas is diffused in the space on the top surface side of the gas diffusion board 202 (rear side with respect to the processing chamber) filling this space, and then introduced into the processing container via a plurality of through holes arranged in the center of the gas diffusion board 202. The vacuum pump 206 is driven at the same time as the processing gas is introduced. Based on a result detected by a vacuum gauge 213 and according to a command signal sent from a control unit (not shown), a gas supply/exhaust balance in upper and lower parts of the processing chamber is adjusted and the pressure in the processing chamber is kept within a range of values suitable for processing through a rotation operation of a conductance adjustment valve 205 provided with a plurality of tabular flaps rotatable around a shaft disposed between an exhaust opening disposed at the bottom of the processing chamber and an inlet of the vacuum pump 206.

Molecules and atoms of the processing gas introduced into the processing chamber are excited and transformed into plasma through a resonance phenomenon caused by interaction between an electric field supplied from electric field supply means 210 such as a magnetron and a magnetic field supplied from a solenoid coil 212. Molecules of the processing gas are ionized into ions and electrons or dissociated into radicals.

The processing chamber in the present embodiment has a substantially cylindrical shape and the vacuum container 204 also has a cylindrical shape. A gas dispersion board 203 is a circular dielectric tabular member, and the cylindrical part of the processing chamber and the disk of the gas dispersion board 203 are concentrically arranged.

The sample stage 207 disposed in the processing chamber, on a top surface of which the sample W is mounted, has a substantially cylindrical shape, and the mounting surface which is the top surface of the sample stage 207 on which the disk-shaped sample W is mounted also has a circular or quasi-circular shape. The mounting surface is configured by including a dielectric film that covers the top surface of the sample stage 207 and the sample W which is a processing target is chucked and held to the top surface of the dielectric film of the mounting surface by an electrostatic force formed thereon during processing.

An electrode made of a disk-shaped or cylindrical conductive member is disposed inside the sample stage 207 and a high-frequency bias power supply 211 is connected to the electrode. During the processing on the sample W, a bias potential is formed above the top surface of the sample W in accordance with the potential of the plasma 203 by a high-frequency voltage applied to the electrode from the high-frequency bias power supply in a state in which the sample W is held to the top surface of the sample stage 207 and the plasma 203 is formed. With the potential difference between the two, it is possible to promote etching processing on a film to be processed having a film structure formed by laminating a plurality of film layers formed beforehand and arranged on the top surface of the sample W by attracting charged particles such as ions in the plasma 203 to the surface of the sample W and causing them to collide therewith, through interaction of physical reaction and chemical reaction taking place with the film structure.

The dielectric film on the top surface of the sample stage 207 may be formed by thermally spraying a dielectric material over the top surface of the sample stage 207 to a predetermined thickness or may be formed by adhering a member formed as a disk of a predetermined thickness to the top surface of the sample stage 207 beforehand using a manufacturing method such as sintering. Furthermore, in the present embodiment, a plurality of film-shaped electrodes are arranged inside the dielectric film for generating an electrostatic force by which the sample W is chucked to the top surface, as will be described later.

Figure 3:
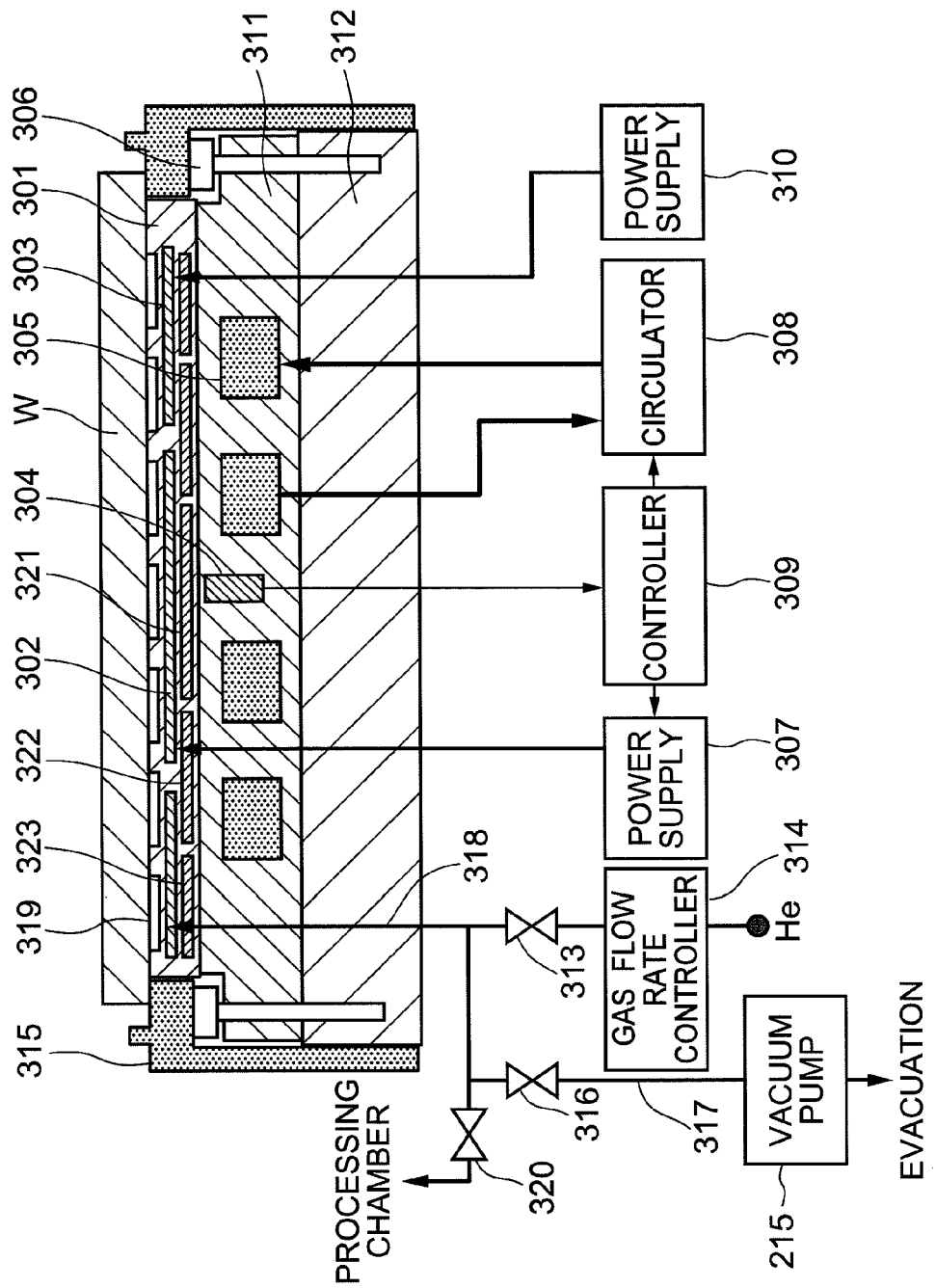
FIG. 3 is an enlarged longitudinal cross-sectional view schematically illustrating a configuration of a sample stage of the plasma processing apparatus according to the embodiment shown in FIG. 2.

FIG. 3 shows details of the configuration of the sample stage 207. FIG. 3 is an enlarged longitudinal cross-sectional view schematically illustrating the configuration of the sample stage of the plasma processing apparatus according to the embodiment shown in FIG. 2.

In the present drawing, the disk-shaped sample W is mounted on the top surface of a dielectric film 301 formed on the top surface of the sample stage 207 as illustrated in the drawing.

As described above, a head 311 which is a conductive disk-shaped member serving as an electrode is disposed inside the sample stage 207 and the dielectric film 301 is disposed so as to have a convex-shaped cross section, covering the top surface of a cylindrical convex portion disposed in the center of the head 311. Inside the head 311, a coolant channel 305 is arranged in a multiple concentric arc shape or spiral shape through which a heat exchange fluid flows, and when the coolant which has passed through the coolant channel 305 and exchanged heat circulates, the temperature of the head 311 is thereby adjusted to within a predetermined range and the temperature of the sample stage 207 is consequently controlled.

Regarding the heat exchange fluid, through a circulator 308 connected to an inlet and outlet of the coolant channel 305 disposed in the sample stage 207 via a conduit, the coolant circulates by flowing out of the outlet of the coolant channel 305 and then flowing toward the inlet of the coolant channel 305 adjusted to a desired temperature and flow rate. The present embodiment provides a plurality of film-shaped heaters inside the dielectric film 301 or inside the top part of the head 311 and adjusts the temperature of the top surface of the dielectric film 301 through the heat generated by the heater.

A central heater 321 having a circular shape in a top view, intermediate heaters 322 having a ring shape in a top view disposed outside and adjacent to the heater 321 and outer circumferential heaters 323 are arranged inside the dielectric film 301 disposed on the circular top surface of the head 311 of the present embodiment, and the heaters are respectively connected to a DC power supply to receive power of independent values. These power values are adjusted based on command signals from the controller 309 made up of a CPU or the like as will be described later.

A temperature at the top of the head 311 in the sample stage 207 is detected by a temperature sensor 304 disposed in the head 311. A signal outputted from the temperature sensor 304 is received by a controller 309 disposed outside the sample stage 207 via communication means, whereby a temperature of the mounting surface of the sample stage 207 or a temperature of the sample W is detected. The controller 309 is provided with a microprocessor (computing unit) such as a so-called CPU, memories such as RAM and ROM, a storage apparatus such as a hard disk, an interface for exchanging signals with outside devices and communication means such as cables to connect between these components and transmit signals. The computing unit uses signals from the temperature sensor 304 received via the interface to detect a temperature of the head 311 or the top surface of the dielectric film 301 of the sample stage 207 based on an algorithm such as software recorded beforehand read from the storage apparatus, calculates a temperature and a flow rate of the heat exchange fluid to set the detected temperature to a desired temperature, and power to be supplied to the heaters 321, 322 and 323, transmits command signals to respective power supplies of the circulator 308 and the heaters 321, 322 and 323 and adjusts the set temperature, the amount of heating or the amount of power supplied.

Note that a disk-shaped sample stage base 312 is disposed below the head 311, and the sample stage base 312 and the head 311 are connected together via a plurality of bolts 306 arranged in a concave part disposed on the outer circumferential side of the cylindrical convex part of the head 311 and extending in a vertical direction. A ring-shaped cover 315 placed on a ring-shaped bottom surface of a stepped part of the concave part is disposed so as to cover side walls of the bolts 306, head 311 and sample stage base 312 together with the cylindrical side wall of the convex part of the head 311, thus reducing interaction of these members with the plasma 203 in the processing chamber.

Film-shaped electrodes 302 and 303 for electrostatic chuck are arranged inside the dielectric film 301. By applying a DC voltage supplied from power supplies 307 and 310 to these electrodes 302 and 303, polarization is induced in the sample W across the dielectric film 301 to chuck (electrostatic chuck) the sample W to the top surface of the dielectric film 301. Furthermore, a concave part or groove having a predetermined shape is formed beforehand on the surface of the dielectric film 301 and a clearance space 319 is formed between the reverse side of the sample W and the dielectric film 301 when the sample W is chucked to the top surface thereof.

The clearance space 319 is filled with a heat-transfer gas such as helium to increase heat transfer efficiency between the head 311 and the sample W. The flow rate of this helium gas is controlled by a gas flow rate controller 314 so that the pressure of the gas filling the clearance space 319 becomes a set value. The helium gas filling the clearance space can be exhausted by opening the valve 316. Alternatively, opening a valve 320 allows the clearance space 319 and the processing chamber to be set to an equivalent pressure. That is, when the valve 320 is opened while the interior of the processing chamber is being evacuated to a high degree of vacuum using the exhaust pump 206, the clearance space 319 can also be evacuated to a high degree of vacuum in the like manner.

Figure 4:
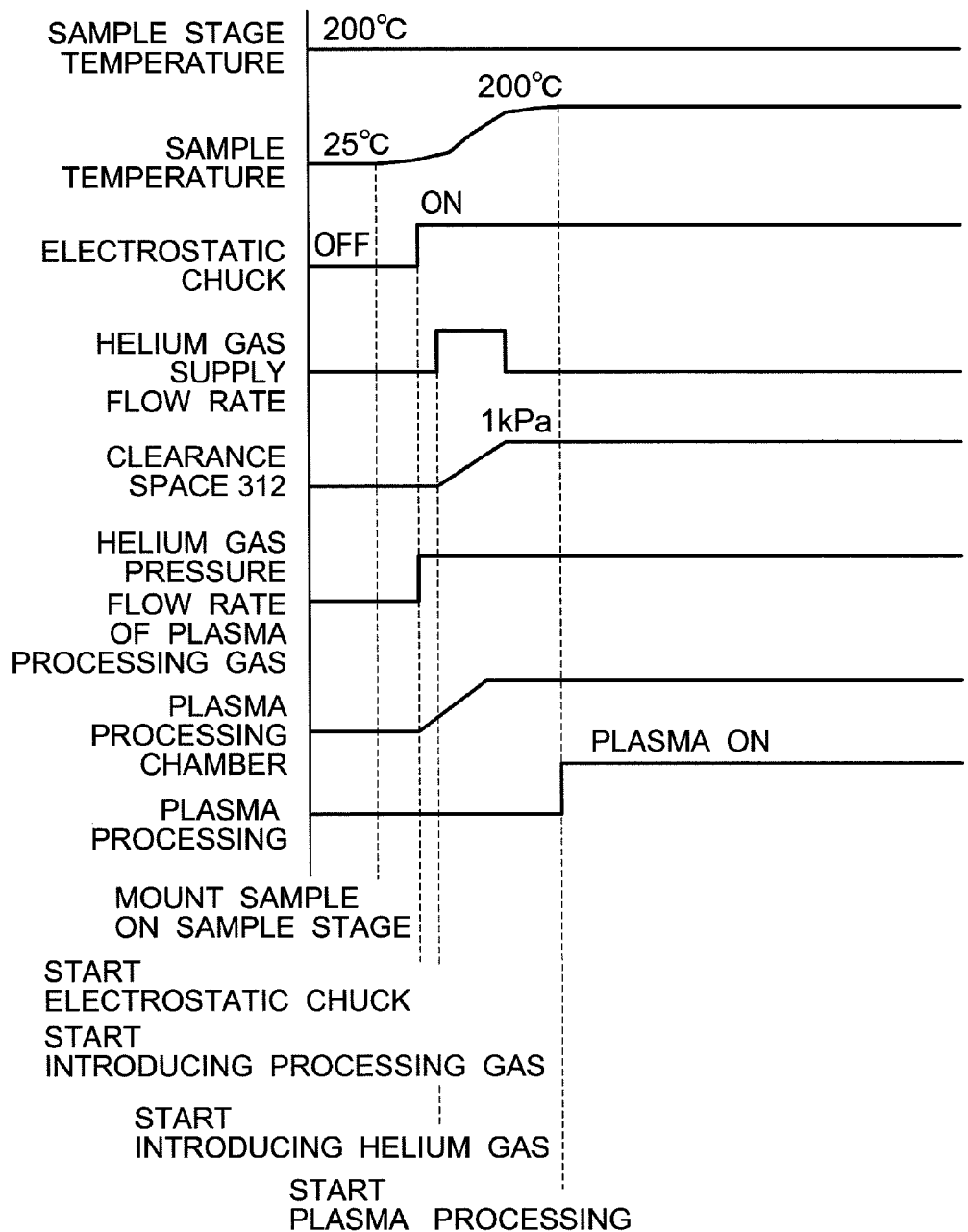
FIG. 4 is a time chart illustrating an operation flow associated with a time variation of a conventional plasma processing apparatus.

Here, FIG. 4 shows a sequence after the sample W is introduced into the plasma processing chamber until plasma processing starts. FIG. 4 illustrates a conventional sequence before using the present invention. In the present drawing, suppose plasma processing is carried out while controlling the temperature of the sample W to 200° C. and the temperature of the sample W before being introduced into the plasma processing chamber is supposed to be a normal temperature (e.g., 25° C.).

In the present drawing, the temperature of the sample stage is a temperature set to achieve 200° C. as a temperature suitable for processing or starting processing, and the amount of heat generation of the heaters 321, 322 and 323 and the temperature of the coolant in the circulator 308 are adjusted. According to such a prior art, the sample W introduced into the processing chamber is mounted on the sample stage, then electrostatically chucked onto the top surface of the dielectric film disposed on the top surface of the sample stage, a He gas for heat conduction is introduced into the clearance space between the reverse side of the sample W and the sample stage, and the sample W is heated by exchanging heat with the sample stage using this heat transfer gas as a medium.

After that, while the processing gas is being introduced into the processing chamber, the pressure in the processing chamber is controlled to within a desired range of values. Once the temperature of the sample W is detected to fall within the desired range appropriate for the processing, an electric field or a magnetic field is shared in the processing chamber, plasma is formed using the processing gas and processing of the sample W starts.

In such an operation of processing, according to the technique in the present drawing, the sample W when electrostatically chucked to the sample stage receives heat from the sample stage and thermally expands, and therefore friction is generated due to a difference in magnitude of thermal expansion between the sample W and the top surface of the mounting surface of the sample stage. For this reason, the sample W or the mounting surface which is the top surface of the sample stage may be damaged or worn out due to the friction, micro foreign substances may be produced, and surface roughness of the sample stage may be changed, resulting in a problem that heat transfer efficiency between the sample W and the sample stage changes and processing performance changes with time.

Figure 5:
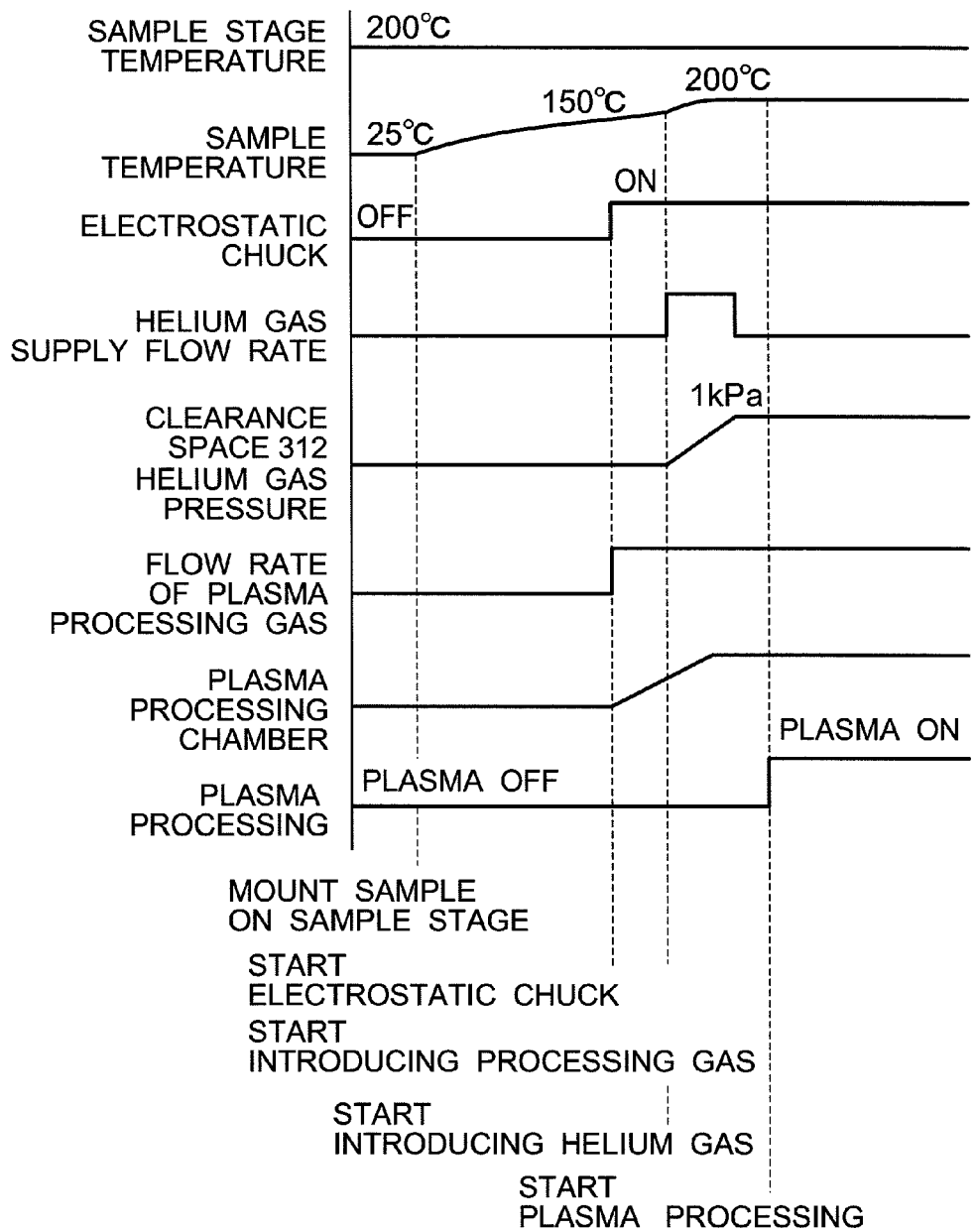
FIG. 5 is a time chart illustrating an operation flow associated with a time variation of the plasma processing apparatus according to the embodiment shown in FIG. 2.

An operation flow of the processing on the sample W by the plasma processing apparatus according to the present embodiment will be described using FIG. 5. FIG. 5 is a time chart illustrating an operation flow associated with a time variation of the plasma processing apparatus according to the embodiment shown in FIG. 2.

In the present embodiment, by heating the sample W without the sample W being electrostatically chucked onto the dielectric film 301 on the top surface of the sample stage 207, the amount of wear generated between the sample W and the top surface of the sample stage 207 (top surface of the dielectric film 301) is reduced to an allowable limit or below even if the sample W thermally expands. The tolerance value of the temperature variation of the sample W when the sample W is chucked to the sample stage 207 differs depending on the type of the sample W, plasma processing conditions or the material of the sample stage 207 or the like, selected by the user and adjusted according to a command signal from the controller 309.

In the present embodiment, after the sample W at a normal temperature (25° C.) is mounted on the top surface of the sample stage 207 adjusted to a set value of 200° C., the sample W is held onto the sample stage 207 (dielectric film 301) for a predetermined time or until the temperature of the sample W is detected to have a value within the predetermined range. In the meanwhile, through a heat transfer by contact between the sample W and the top surface of the dielectric film 301, the sample W is gradually heated by the heaters 321, 322 and 323 or through heat exchange with the coolant flowing through the coolant channel 305 inside the head 311.

When the sample W is heated immediately after the mounting to a temperature of 150° C., the sample W is electrostatically chucked onto the top surface of the dielectric film 301, a helium gas for a heat transfer is introduced into the clearance space between the reverse side of the sample W and the dielectric film 301, and further the sample stage 207 or head 311 is heated to 200° C. which is a condition appropriate for plasma processing to form the plasma 203 in the processing chamber and etching processing on the sample W starts. At this time, the pressure of the helium gas introduced between the sample W and the dielectric film 301 is controlled to, for example, 1 kPa.

When the sample W is mounted on the dielectric film 301 on the top surface of the sample stage 207, a heat transfer is performed between the sample stage 207 and the sample W with no DC power being applied to the inside electrode 302 and the outside electrode 303, the sample W not being chucked to the dielectric film 301 but being held onto the sample stage 207. Moreover, when the sample W is mounted on the dielectric film 301, power may be supplied only to the inside electrode 302, only the center part of the sample W may be chucked through electrostatic chuck to perform a heat transfer, and after detecting that the sample W has reached a predetermined temperature, power may be supplied to the outside electrode 303 to hold the sample W by a chuck force appropriate for etching processing. Furthermore, smaller power than the power supplied during the processing on the sample W may be supplied to the inside electrode 302 and the outside electrode 303 to hold the sample W by a chuck force of smaller static electricity than that during processing, the sample W may be heated to a predetermined temperature, then greater power may be supplied to the inside electrode 302 and the outside electrode 303 to achieve a chuck force appropriate for processing, and etching processing may be started after holding the sample W.

In the above-described embodiment, after the sample W is mounted on the mounting surface of the dielectric film 301 on the sample stage 207 until the sample W is heated from a normal temperature (25° C.) to a predetermined temperature of 150° C., at least part of the sample W is not electrostatically chucked to the dielectric film 301, and on the reverse side of this non-electrostatically-chucked region of the sample W, even when the sample W and the dielectric film 301 thermally expand, a frictional force between the two is small, and wear and damage are reduced to a negligible order of magnitude. When the sample W is heated from 150° C. to 200° C., since the sample W is wholly electrostatically chucked onto the dielectric film 301 including a portion not chucked so far, although friction occurs between these parts in accordance with the difference in thermal expansion between the sample W and the dielectric film 301, the range of temperature difference within which the above-described friction or damage can be tolerated is assumed to be 50° C. or below in the present embodiment.

Figure 6:
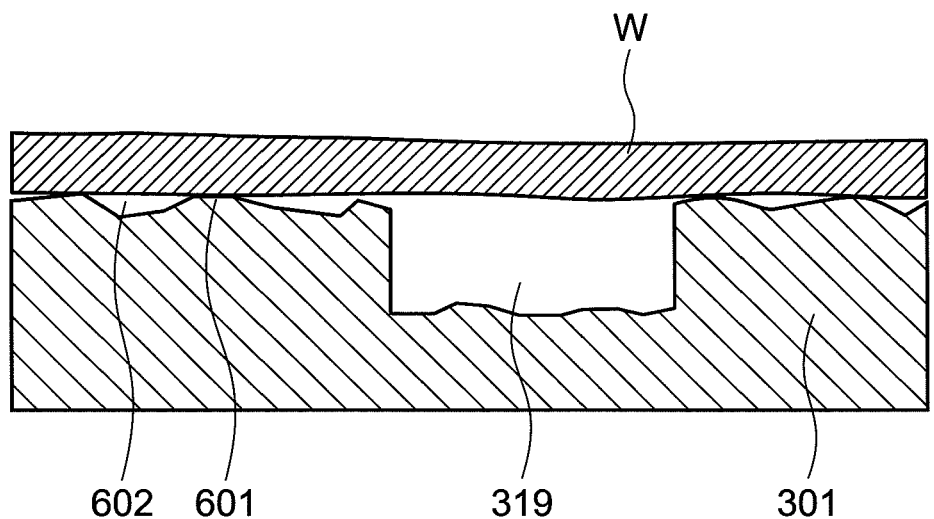
FIG. 6 is an enlarged longitudinal cross-sectional view schematically illustrating a contacting portion between the sample and the sample stage of the plasma processing apparatus according to the embodiment shown in FIG. 2.

On the other hand, since the reverse side of the sample W and the top surface of the dielectric film 301 of the sample stage 207 respectively have surface roughness, when the reverse side of sample W is in contact with the top surface of the dielectric film 301 as shown in FIG. 6, a contacting part 601 and a micro clearance 602 are formed therebetween in accordance with the shape of the surface representing the corresponding roughness. In the operation shown in FIG. 5, when the sample W is heated through heat exchange with the sample stage 207 while the sample W is not electrostatically chucked onto the dielectric film 301, the interior of the processing chamber is kept to a low pressure with a high degree of vacuum, and it is therefore set to a lower pressure with a higher degree of vacuum than the micro clearance 602 and a heat transmission coefficient of the micro clearance 602 is extremely low.

For this reason, a heat transfer takes place substantially only at the contacting part 601 between the sample W and the dielectric film 301, but this contacting area is extremely small compared to the area of the entire reverse side of the sample W. Thus, the efficiency of heat transfer between the sample W and the sample stage 207 is relatively small. On the other hand, when the processing time is sufficiently short compared to the time required to transfer the sample W or the time required to cool the sample after the processing, the influence on the overall sample W handling time after transferring the sample W required for processing from the cassette until the sample W is returned to the original position of the cassette after the processing is relatively small.

However, when the plasma processing time is sufficiently long with respect to the time required to transfer the sample W and productivity deteriorates due to an addition of the sample W heating time before the plasma processing, the sample W needs to be efficiently heated without the sample W being electrostatically chucked to the sample stage. Modification example 1 shows means for solving this problem.

Figure 7:
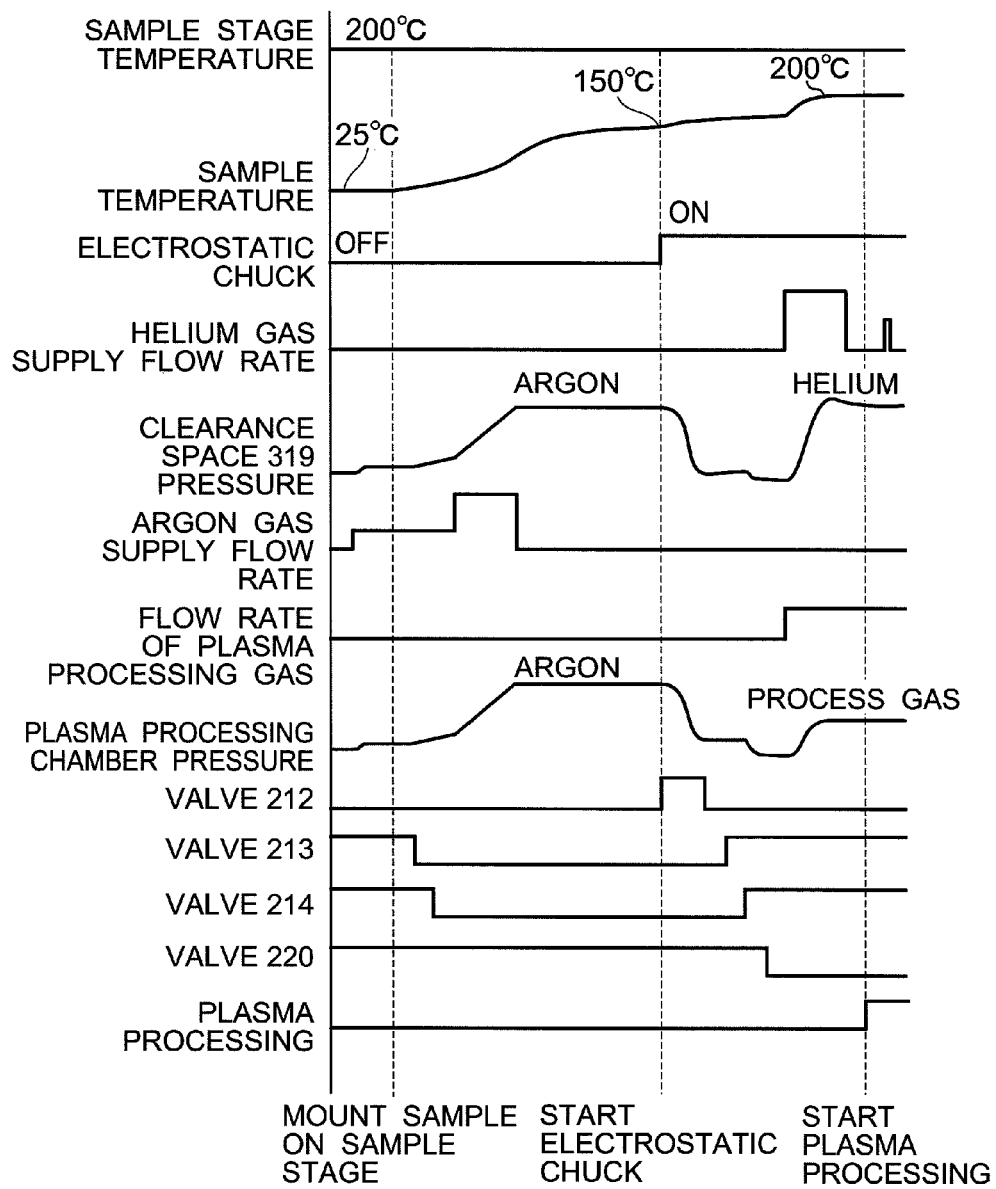
FIG. 7 is a time chart illustrating an operation flow associated with a time variation of a plasma processing apparatus according to a modification example of the embodiment shown in FIG. 2.

An operation flow of processing on the sample W by the plasma processing apparatus according to modification example 1 will be described with reference to FIG. 7. FIG. 7 is a time chart illustrating an operation flow associated with a time variation of the plasma processing apparatus according to the modification example of the embodiment shown in FIG. 2.

As described above, when the clearance space 319 between the sample W and the sample stage, and the micro clearance 602 maintain a high degree of vacuum, heat transfer efficiency between the sample W and the sample stage is small and heating of the sample W takes time. On the other hand, when the clearance space 319 and the micro clearance 602 are filled with the heat transfer gas, heat transfer efficiency between the sample stage 207 and the sample W improves, but when the heat transfer gas is introduced into the clearance space 319 and the micro clearance 602 without the sample W being electrostatically chucked to the sample stage, there is concern that a high gas pressure may be applied to only the reverse side of the sample W causing the sample W to leap or when the heat transfer gas flows out of the space between the sample w and the sample stage, the sample W may slide over the sample stage, causing the central position to deviate or the sample W may drop off the sample stage.

Thus, the present example improves the wafer heating efficiency by relatively increasing the pressure in the entire vacuum container including the clearance space 319 and micro clearance 602.

That is, in the present example, a mixed gas which is a mixture of a plurality of types of gases is used as the plasma processing gas and is introduced into the processing chamber via the gas diffusion board 202. While the sample W is mounted on the top surface of the dielectric film 301 of the sample stage 207 and before starting the processing, the inside and outside of the processing chamber are made to communicate with each other, the gate through which the sample W is transferred is hermetically closed to seal the processing chamber, an inert gas or diluent gas out of the processing gas, for example, argon gas is introduced into the processing chamber so as to keep the pressure of the processing chamber to several hundreds of Pa to substantially on the order of an atmospheric pressure. In this case, by opening the valve 320, the argon gas is also supplied to the clearance space 319 between the sample W and the sample stage 207 or the top surface of the dielectric film 301, and the micro clearance 602, the argon gas filling these spaces.

Promoting the heat transfer between the sample stage 207 and the sample W using the argon gas as a heat transfer medium improves heating efficiency of the sample W. In addition, since the gas fills the entire vacuum container 204 including the front and reverse sides of the sample W at a substantially uniform pressure, while the clearance space 316 and the micro clearance 602 are kept at a high pressure, the pressure difference between the front and reverse sides of the sample W is none or minimal, and this prevents the sample W from isolating above from the sample stage 207 or sliding over the sample stage 207, or even if such isolation or sliding occurs, the amount of deviation from a predetermined position of the sample W pre-positioned and mounted on the sample stage 207 is reduced.

Details of the present operation flow will be described with reference to FIG. 7. After mounting the sample W on the top surface of the dielectric film 301 on the sample stage 207, the valves 213 and 214 are closed to stop evacuation of the processing chamber inside the processing container. At this time, the valves 213 and 214 are closed and the space including the vacuum pump 206 isolated from outside is kept at a high degree of vacuum and the operation of the vacuum pump 206 including the turbo molecular pump is maintained.

In this condition, a diluent gas or inert gas used as the processing gas, for example, argon gas is introduced into the processing chamber, the introduction of the gas is continued until the pressure inside the processing chamber becomes a predetermined pressure, for example, 1 kPa, the introduction is then stopped and the interior of the processing chamber is kept at a predetermined pressure. In this case, the valve 320 is kept fully open before the introduction of the argon gas until stoppage thereof, the argon gas is also supplied into the clearance space 319 and the micro clearance 602 and the pressure in these spaces are kept equivalent to the pressure inside the processing chamber.

The thickness of the clearance space 319 in the present example is several tens of micrometers and the thickness of the micro clearance 602 is on the order of several hundreds of nanometers, and since these inside gases become molecular flows at a pressure on the order of 1 kPa, the heat transfer efficiency increases in proportion to the pressure. That is, by increasing the pressures inside the clearance space 319 and the micro clearance 602, it is possible to cause a heat transfer to take place between the sample stage 207 and the sample W with high efficiency using the argon gas as a heat transfer medium.

In the present example, a temperature appropriate for processing on the sample W or a temperature to be realized before starting the processing is set to 200° C., and to realize this, the temperature of the coolant adjusted by the heaters 321, 322 and 323 and the circulator 308 is set to a temperature capable of heating the sample stage 207. For this reason, after the sample W is mounted on the dielectric film 301, the sample W is heated through a heat transfer by contact with the dielectric film 301 and a heat transfer by the argon gases in the clearance space 319 and the micro clearance 602, and when it is detected by the controller 309 which has received the output from the temperature sensor 304 that after the mounting of the sample W, a predetermined time has elapsed after starting a supply of the argon gas or that the temperature of the sample W has reached a predetermined temperature (150° C. which is a temperature lower by a predetermined value than the above-described set temperature of 200° C. in the present example), the controller 309 opens the valve 212 to rapidly evacuate the inside of the vacuum container 204 and reduce the pressure therein.

When the pressure inside the processing chamber is reduced to or below a pressure safe enough to operate the vacuum pump 206, the valve 213 and the valve 214 are opened, and the inside of the processing chamber is evacuated using the vacuum pumps 206 and 215 to a high degree of vacuum to reduce the pressure therein. At this time, the valve 320 is open, and together with the inside of the processing chamber, the insides of the clearance space 319 and the micro clearance 602 are also evacuated to a high degree of vacuum to reduce the pressures therein.

When it is detected through the controller 309 which has received the output from the vacuum gauge 213 that the internal pressure of the processing chamber has been reduced for a predetermined time or to a predetermined pressure, the sample W is electrostatically chucked to the top surface of the dielectric film 301 based on a command signal from the controller 309 and a helium gas for a heat transfer is supplied to the clearance space 319 and the micro clearance 602. In this condition, the sample W is heated again and when it is detected through the controller 309 which has received the output from the temperature sensor 304 that a predetermined time has elapsed after chucking of the sample W or that the temperature of the sample W has become a value within a predetermined allowable range with respect to a set temperature, the plasma 203 is formed inside the processing chamber based on a command signal from the controller 309 and processing on the sample W starts.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing method, comprising:
mounting a sample to be processed on a dielectric film on a sample stage, disposed in a lower part of a processing chamber inside a vacuum container, such that a clearance space is formed between a reverse side of the sample and a surface of the dielectric film, the clearance space being in communication with an interior of the processing chamber;
introducing an inert gas into the interior of the processing chamber and the clearance space to increase a pressure in the processing chamber above a plasma processing start pressure;
holding the sample on the sample stage until a sample temperature increases to a predetermined temperature that is lower, by a predetermined value, than a plasma processing start temperature or until a predetermined time elapses;
evacuating the interior of the processing chamber and the clearance space to reduce the pressure in the processing chamber;
chucking the sample onto the sample stage by supplying power to electrodes arranged inside the dielectric film;
supplying a heat transfer gas to the clearance space;
increasing the sample temperature to within a predetermined allowable temperature range of the plasma processing start temperature;
supplying processing gas into the processing chamber; and
processing the sample using plasma.

2. The plasma processing method according to claim 1, wherein the clearance space and the inside of the processing chamber communicate with each other via a passage disposed inside the sample stage.

3. The plasma processing method according to claim 1, wherein, when the sample is mounted on the sample stage, power is supplied to the electrodes to hold the sample until the sample temperature increases to the predetermined temperature or until a predetermined time elapses, and power to the electrodes is then increased to strongly chuck the sample to the dielectric film.

4. The plasma processing method according to claim 1, wherein the electrodes include an inner electrode disposed in a central part of the surface of the dielectric film on which the sample is mounted, and an outer electrode disposed in a circumferential region adjacent thereto, and wherein, after the sample is mounted on the sample stage, power is supplied to the inner electrode to hold the sample until the sample temperature increases to the predetermined temperature or until a predetermined time elapses, and power is then supplied to the outer electrode to chuck the sample to the dielectric film.

\* \* \* \* \*